US006532028B1

(12) United States Patent
Gailus et al.

(10) Patent No.: US 6,532,028 B1
(45) Date of Patent: Mar. 11, 2003

(54) INK JET PRINTER HAVING A CERAMIC PIEZOELECTRIC TRANSDUCER

(75) Inventors: David W. Gailus, Merrimack, NH (US); Paul A. Hoisington, Norwich, VT (US)

(73) Assignee: Spectra, Inc., Lebanon, NH (US)

( * ) Notice: Subject to any disclaimer, the term of this patent is extended or adjusted under 35 U.S.C. 154(b) by 1020 days.

(21) Appl. No.: 09/033,873

(22) Filed: Mar. 3, 1998

Related U.S. Application Data

(62) Division of application No. 08/673,162, filed on Jun. 26, 1996, now Pat. No. 5,755,909.

(51) Int. Cl.⁷ .................................................. B41J 2/045
(52) U.S. Cl. ...................................................... 347/70
(58) Field of Search ............................. 347/71, 70, 68, 347/48, 88; 156/229, 221, 233, 196, 241, 276, 239, 230, 235, 212; 29/25.35; 310/311, 365, 324, 325, 328, 330, 358, 363

(56) References Cited

U.S. PATENT DOCUMENTS

| 4,835,554 | A | * | 5/1989 | Hoisington et al. ............ 347/71 |
| 5,265,315 | A | * | 11/1993 | Hoisington et al. ......... 347/71 X |
| 5,394,179 | A | * | 2/1995 | Vandagriff et al. ............. 347/70 |
| 5,554,247 | A | * | 9/1996 | Pies et al. .................. 347/71 X |
| 5,605,659 | A | * | 2/1997 | Moynihan et al. ......... 347/71 X |
| 5,659,346 | A | * | 8/1997 | Moynihan et al. ......... 347/71 X |
| 5,755,909 | A | * | 5/1998 | Gailus ......................... 156/229 |
| 5,771,052 | A | * | 6/1998 | Hine et al. ..................... 347/42 |

* cited by examiner

Primary Examiner—Hezron Williams
Assistant Examiner—Charlene Dickens
(74) Attorney, Agent, or Firm—Baker Botts, LLP

(57) ABSTRACT

In the embodiments described in the specification, a piezoelectric transducer has electrodes to the piezoelectric layer with an adhesive bonding agent under pressure applied hydraulically so as to be distributed uniformly throughout the surface of the piezoelectric layer. In one embodiment the dielectric film also carries conductor arrays for connecting the electrodes to remote driver chips at locations spaced from the surface of the piezoelectric layer.

6 Claims, 5 Drawing Sheets

INK JET PRINTER HAVING A CERAMIC PIEZOELECTRIC TRANSDUCER

REFERENCE TO RELATED APPLICATION

This application is a division of application Ser. No. 08/673,162 filed Jun. 26, 1996 now U.S. Pat. No. 5,755,909 issued May 26,1998.

BACKGROUND OF THE INVENTION

This invention relates to the application of electrodes to ceramic piezoelectric transducers.

Piezoelectric transducers must be provided with electrodes which have good electrical coupling to the piezoelectric transducer surface in order to produce the maximum possible deformation of the transducer in response to applied electric potentials. Ceramic piezoelectric transducers of the type used in ink jet systems, such as shear mode transducers which are in the form of a thin plate or layer of ceramic material like lead zirconium titanate (PZT), must be provided with a series of closely spaced electrodes on one or both surfaces. Heretofore, because of the granular surface structure of such ceramic materials, it has been necessary to apply electrodes to those surfaces by evaporating or sputtering thin layers of metal, such as copper or gold, onto the surfaces in order to provide high capacitive coupling, before subjecting the piezoelectric layer to an electric field to pole the piezoelectric material.

Conventional poling techniques for such piezoelectric transducers require that the electrode metal be applied in that manner to both surfaces before the piezoelectric material is polarized in order to obtain maximum polarization. Thereafter the previously applied electrode metal may be patterned by photolithographic etching techniques to provide electrodes at the desired locations on the opposite surfaces of the piezoelectric layer.

Recently, however, poling techniques for polarizing piezoelectric transducers have been developed which do not require prior application of metal layers to the transducer surfaces. For example, in the copending Moynihan et al. application Ser. No. 08/460,393 filed Jun. 2, 1995 now U.S. Pat. No. 5,605659 and its parent application Ser. No. 08/406,297 filed Mar. 17, 1995, the disclosures of which are incorporated herein by reference, pressure poling and corona poling techniques are disclosed which eliminate the need for the presence of electrodes on the surfaces of the transducer material for poling of the material.

Furthermore, since the application of electrode material to the surfaces of piezoelectric materials by conventional evaporation or sputtering techniques is a complex procedure and represents a substantial portion of the cost of producing electroded piezoelectric transducers, it would be advantageous to provide a way of electroding piezoelectric transducers without requiring such complex and expensive steps. In addition, conventional piezoelectric transducers have electrodes which cannot be extended beyond the area of a surface of the transducer and thus require connection to remote actuating circuits by separate electrical leads, adding to the complexity and expense of manufacture.

SUMMARY OF THE INVENTION

Accordingly, it is an object of the present invention to provide a method for electroding piezoelectric transducers which overcomes the disadvantages of the prior art.

Another object of the invention is to provide electroded piezoelectric transducers and ink jet printheads incorporating such transducers which do not require the complex and expensive electroding procedures of the prior art.

A further object of the invention is to provide a method for electroding piezoelectric transducers which eliminates the need for wiring connections at a surface of the piezoelectric transducer.

These and other objects of the invention are attained by applying a pattern of deformable electrode material corresponding to the desired electrode pattern to a surface of the piezoelectric material under sufficient pressure to assure uniform and high electrical coupling between the conductors and the surface of the piezoelectric material. In one embodiment the pattern of electrode conductors is formed on one surface of a dielectric film and the electrode pattern is bonded to the surface of the ceramic piezoelectric plate with sufficient uniformly applied pressure to conform the electrode material to granular irregularities in the surface of the piezoelectric plate so as to assure conductive contact between the electrode pattern and localized asperities in the surface of the piezoelectric plate. For this purpose the pressure may be applied through an elastomeric or viscoplastic layer.

Preferably, the dielectric film and electrode film are bonded to the surface of the piezoelectric layer with a thin layer of adhesive material, such as an epoxy resin. Because the adhesive layer has a large effect on the capacitive coupling between the electrode film and the piezoelectric layer, the adhesive layer should be as thin as possible while still assuring good bonding. If desired, the bonding material may incorporate fine particles of high dielectric or conductive material of appropriate size and distribution to provide improved capacitive coupling or localized conduction between the surface of the piezoelectric plate and the electrode without producing surface conduction along the surface of the piezoelectric plate. Furthermore, the dielectric film may be removed from the electrodes, if desired, after the electrodes have been bonded to the piezoelectric plate by making the bond between the electrode material and the piezoelectric layer stronger than that between the dielectric layer and the electrode material.

In order to permit connection of the electrodes on the surface of the piezoelectric plate directly to a remote source of driving voltage, the dielectric layer may extend beyond the edge of the piezoelectric plate and may contain conductors formed of the electrode material which connect the electrode pattern on the piezoelectric layer to a remote driving component, such as for example, an integrated circuit or drive chip which may be affixed to the dielectric film and may contain driving elements for the electrodes located at selected portions of the piezoelectric layer.

For use in an ink jet head, the electroded piezoelectric transducer may be affixed to a chamber plate which is formed with ink pressure chambers corresponding to the electroding applied to one surface of the piezoelectric transducer and the chamber plate may include passages leading from the pressure chambers to drop ejecting orifices. In certain embodiments, the ink jet head may include a chamber plate made of carbon as described in the above-cited Moynihan et al. applications. Moreover, the chamber plate may have ink chambers formed on both sides and piezoelectric transducers with affixed electrodes may be mounted on both sides of the carbon plate with the electrodes positioned in accordance with the chambers formed in the plate.

BRIEF DESCRIPTION OF THE DRAWINGS

Further objects and advantages of the invention will be apparent from a reading of the following description in conjunction with the accompanying drawings, in which.

DESCRIPTION OF PREFERRED EMBODIMENTS

Figure 1:
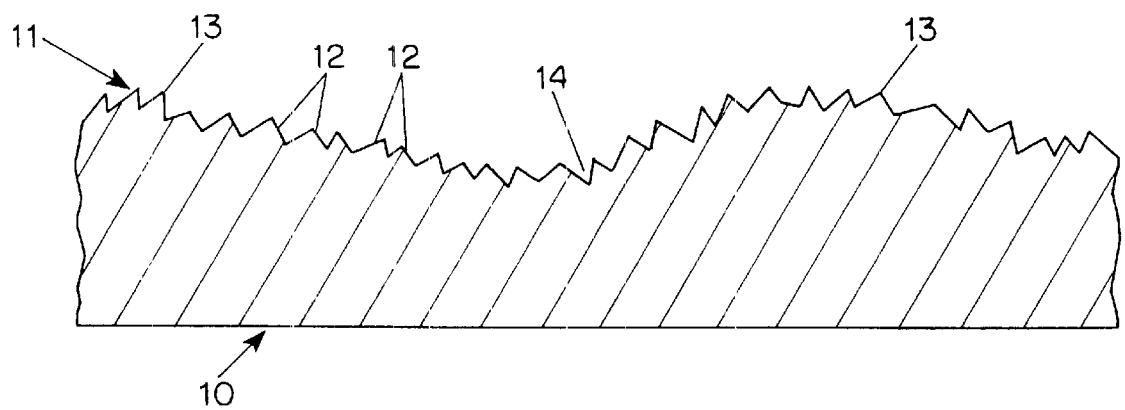
FIG. 1 is fragmentary sectional schematic view illustrating in greatly magnified form a portion of a piezoelectric transducer surface and an electrode layer to be applied to the surface in accordance with a representative embodiment of the invention.
Figure 1A:
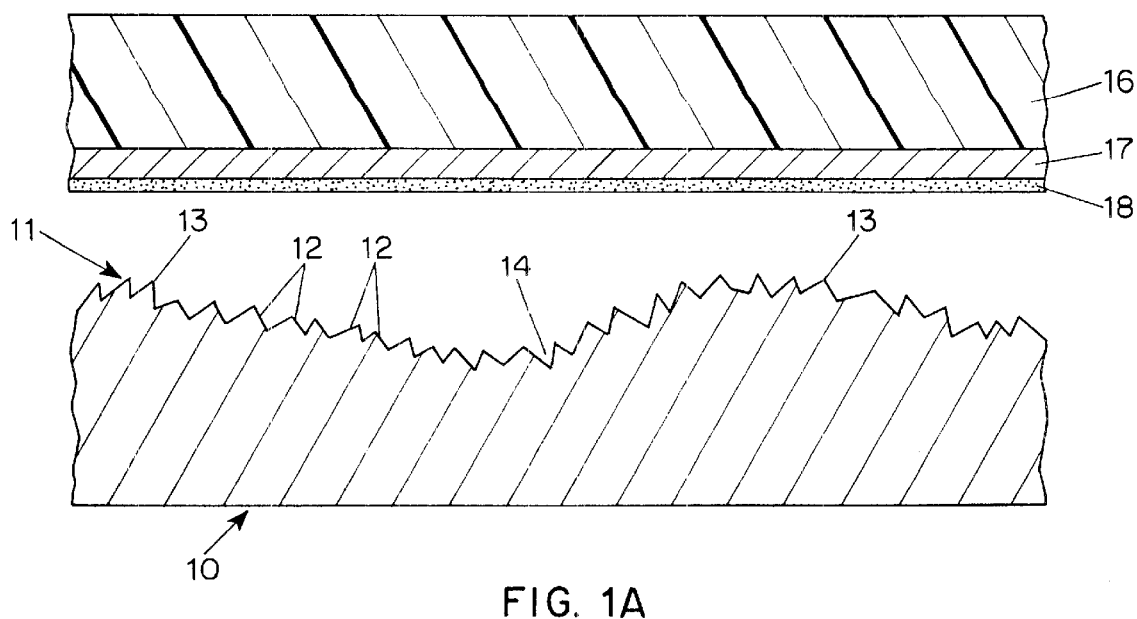

FIG. 1 illustrates in greatly magnified form a portion of a conventional ceramic piezoelectric transducer 10 made, for example, of lead zirconium titanate (PZT) having an upper surface 11 characterized by granular asperities 12 which have a height and spacing of about one to a few microns and having periodic ridges 13 separated by valleys 14 constituting macrovariations in the surface. In typical cases, the valleys 14 may have depths of about ten to a several tens of microns and the ridges may have a spacing of about one hundred to several hundreds of microns.

In order to apply a conductive layer of electrode material to the surface 11 with good electrical coupling, the layer must make electrical contact with substantially all of the asperities 12. For this purpose, the conductive layer must be sufficiently deformable to conform to the macrovariations in the surface 11 without rupture and to permit local deformation by the asperities 12 to an extent sufficient to assure good electrical contact without requiring the application of a pressure which would be great enough to crush the asperities or break the ceramic material. Moreover, secure bonding of the conductive layer to the surface of the ceramic material must be effected without interfering with the electrical contact between the asperities and the conductive material and with high capacitive coupling across the bonding material.

Figure 2:
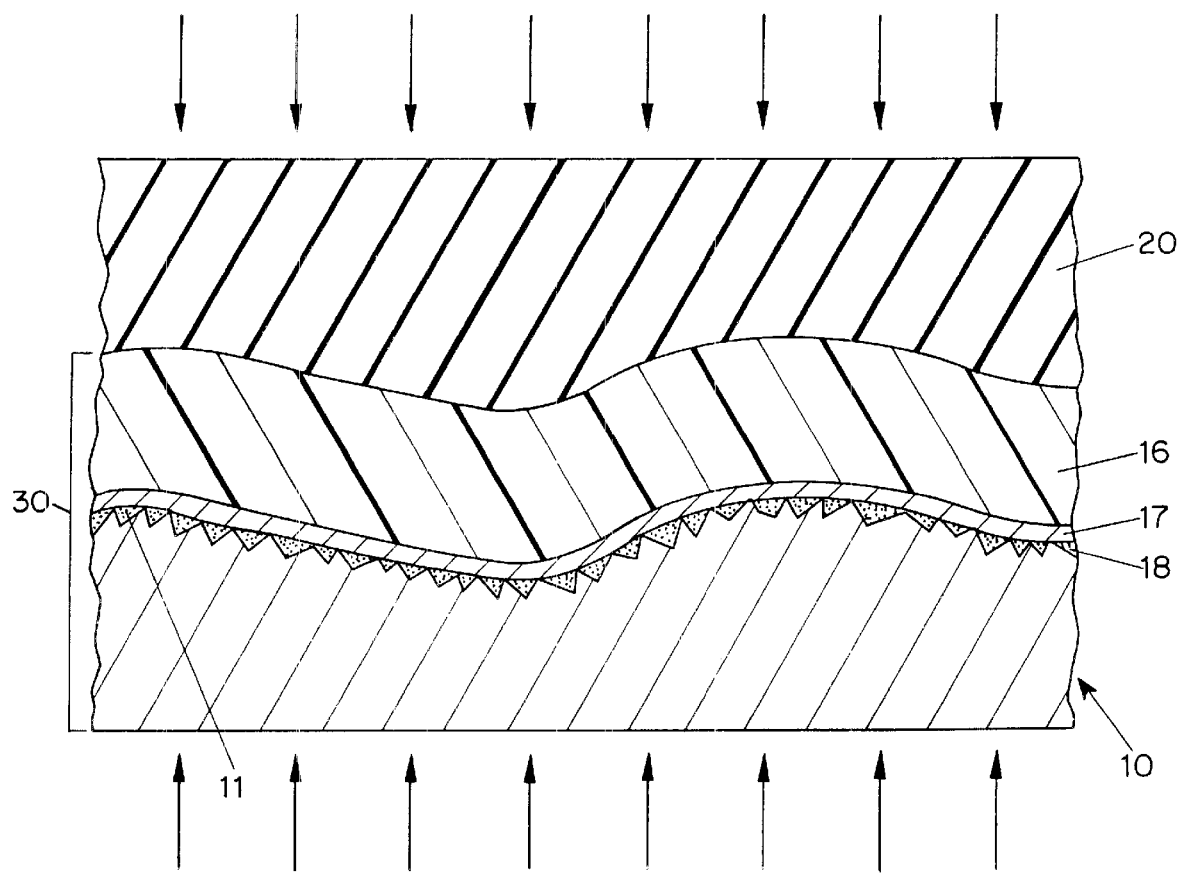
FIG. 2 is a schematic fragmentary sectional view illustrating the engaging surfaces of the piezoelectric layer and the electrode layer of FIG. 1 after application of the electrode layer to the piezoelectric layer in accordance with the invention.

In order to apply a layer of electrode material to the surface 11 in accordance with the embodiment of the invention shown in FIGS. 1 and 2, a film 16 of dielectric material such as a polyester, polyimide, fluorinated ethylene propylene polymer or polytetrafluoroethylene is coated with a metal film 17 of annealed copper or gold leaf, for example, having the appropriate electrode pattern by a conventional technique, such as rolling, electro-deposition, evaporation of the like, and the metal film 17 is then coated with a thin adhesive layer 18, such as an epoxy adhesive, by spraying, for example. If the metal film 17 is an annealed copper film having a thickness of one to a few microns, i.e, on the order of the size of the asperities 12, with a yield strength of about 10,000 psi (704 kg/cm$^2$), which is well below the compressive strength of the individual PZT grains constituting the asperities 12, the copper film can be deformed by the asperities with an applied pressure of about 1000 psi (70.4 kg/cm$^2$), sufficiently that the asperities can pierce the copper oxide surface layer to provide good contact with the copper material.

The ceramic piezoelectric layer 10, however, cannot survive as a bulk material under such loads unless the load is applied in an elastic or hydraulic manner, i.e., applied uniformly over the entire surface 11 despite the surface level irregularities resulting from the macrovariations 13 and 14. For this purpose a deforming and bonding pressure between the metal film 17 and the surface 11 of the ceramic material 10 so as to assure good electrical coupling without breakage of the ceramic material, may be applied in accordance with the invention through a resilient layer 20 made of an elastomeric material, as illustrated in FIG. 2. In this way, the metal film 17 is deformed to conform to the upper surfaces of the asperities 12 with a uniform localized pressure, causing the epoxy adhesive layer 18 to be dispersed uniformly in the regions between the asperities and the dielectric film 16 to be deformed to conform accurately to the macrovariations 13 and 14 in the surface 11 of the ceramic piezoelectric layer without causing the application of local forces which would be high enough to destroy the ceramic layer. Such conformance of the metal layer 17 to the surface 11 produces good electrical contact at the peaks of the asperities 12 and a high and uniform capacitive coupling of the electrode material to the piezoelectric layer in the regions between the asperities throughout the entire surface of the ceramic piezoelectric material, thereby achieving the necessary electrical coupling without requiring expensive evaporation or sputtering deposition or lithographic patterning techniques.

In the typical embodiment shown in FIGS. 1 and 2, in which the surface 11 of the ceramic piezoelectric material 10 has local asperities and macrovariations of the type described above, the dielectric film 16 may comprise a conventional polyimide film of the type identified with the trademark Kapton, having a thickness in the range of about 10 to 100 microns, for example, preferably about 20 to 50 microns and ideally about 25 to 30 microns, the metal layer 17 may be a layer of annealed copper or gold leaf having a thickness of 0.1 to 20 microns, preferably about one to ten microns, and desirably about two to five microns, and the adhesive layer 18 may be a stage B epoxy layer having a thickness of 0.5 micron to about 5 microns, preferably 0.5 micron to 3 microns and desirably about 0.5 to one micron.

As shown in FIG. 2, using an elastomeric layer 20 to distribute the applied force uniformly throughout the entire surface 11, the metal layer 17 carrying the adhesive layer 18 and supported by the dielectric film 16 is pressed against the surface 11 of the ceramic piezoelectric layer 10 by application of uniform pressure through the layer 20 so that the dielectric layer 16 is plastically deformed to conform to the macrovariations in the surface 11 of the piezoelectric layer 10, the epoxy adhesive 18 is forced into the spaces between the asperities 12, and the metal layer 17 is locally deformed by the asperities to conform to the shape of the peaks of the asperities. The elastomeric layer 20 may be a layer of 70 durometer Viton elastomeric material about one to ten mm. thick which will distribute a vertically applied uniform load of at least 500 psi (35.2 kg/cm$^2$) as a uniform pressure throughout the surface of the ceramic piezoelectric layer 10 despite the macrovariations in the surface. While the pressure is applied, the adhesive layer is cured by heating it to at least 150° C. and preferably about 165° C. The temperature is raised to that level in about four minutes and held there for about two hours. A pressure as high as 3,750 psi (264 kg/cm$^2$) can be applied, if necessary, without destroying the ceramic piezoelectric layer as long as the pressure is uniformly distributed over the surface 11.

If desired, the dielectric film 16 may be separated from the metal layer 17 after the metal layer has been bonded to the ceramic layer 10. Such separation by making certain that, throughout the area of the patterned metal film 17, the bond between that layer and the surface 11 of the ceramic piezoelectric layer is stronger than the bond between that layer and the dielectric film 16.

Figure 3:
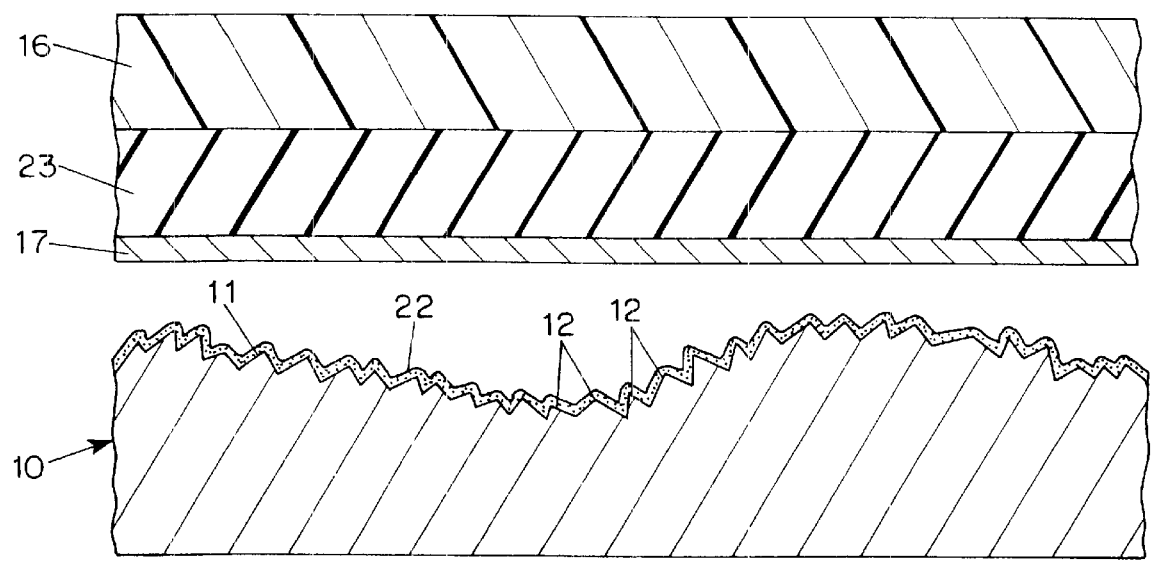
FIG. 3 is a schematic fragmentary and greatly magnified sectional view illustrating the surface of a piezoelectric layer and an electrode layer to be applied to the surface in accordance with another embodiment of the invention.
Figure 4:
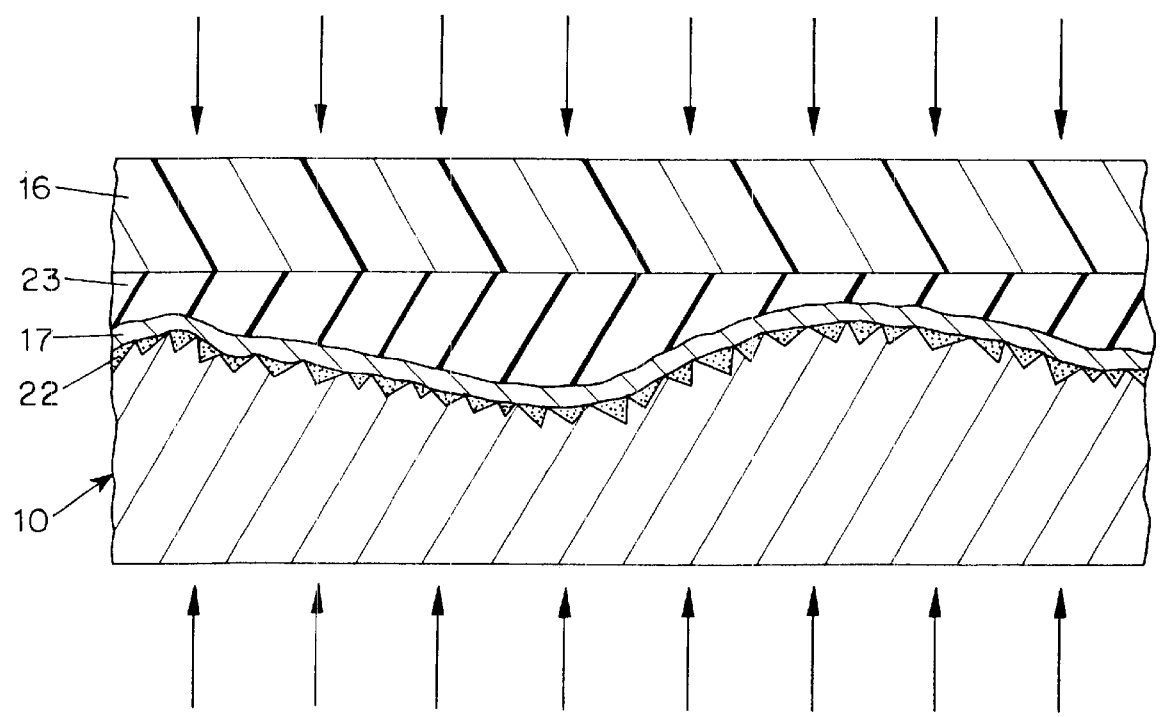
FIG. 4 is a schematic fragmentary sectional view illustrating the surface of a piezoelectric layer and the electrode layer of FIG. 3 after bonding of the electrode layer to the surface.

In the alternative embodiment illustrated in FIGS. 3 and 4, an epoxy adhesive layer 22 is applied to the surface 11 of the ceramic piezoelectric layer 10 so as to conform substantially to the asperities 12 and macrovariations in that surface. In this case, a viscoplastic conforming layer 23 is interposed between the metal layer 17 and the dielectric film 16 and, when a uniform pressure is applied to the dielectric film to force the metal layer 17 against the surface 11, as shown in FIG. 4, the viscoplastic layer 23 is deformed to conform the metal layer to the shape of the surface 11 and to the peaks of the asperities 12 and also forcing the epoxy adhesive 22 into the spaces between the asperities as in the embodiment of FIGS. 1 and 2.

As in the embodiment shown in FIGS. 1 and 2, the arrangement of FIGS. 3 and 4 produces excellent electrical connection between the layer of electrode material and the peaks of the asperities and also provides uniform capacitive coupling between the electrode layer 17 and the ceramic piezoelectric material 10 in the regions between the asperities without requiring application of localized forces which could cause destruction of the ceramic piezoelectric material.

In a typical arrangement shown in FIGS. 3 and 4, the viscoplastic layer 23 may be a fluorinated ethylenepropylene polymer layer having a thickness of about 1 to 10 microns, preferably about 2 to 5 microns, and desirably about 3 or 4 microns while the adhesive layer 22 may have a thickness of about 0.5 to 2 microns and preferably 0.5 to 1 micron, and the electrode layer may be an annealed copper layer having a thickness of about 0.1 to 2 microns and preferably about 0.2 to 1 micron.

Under heat and pressure the fluorinated ethylenepropylene polymer layer conforms to the shape of the ceramic piezoelectric layer 10 in a viscoplastic manner and, to assure good bonding between the metal layer and the surface 11, the flow and curing of the bonding adhesive should match the flow of the fluorinated ethylene propylene polymer material under the bonding conditions. For example, a bisphenol A epoxy resin such a Shell Epon 826, together with a cycloaliphatic amine curing agent such as Air Products Ancamine 2264 will match the flow of the fluorinated ethylene propylene material at a pressure of 1,000 psi (70.4 kg/cm$^2$) when heated to 200° C. for 30 minutes.

In an alternative embodiment, particles of a conductive or very high dielectric constant material are distributed on one of the engaging surfaces of the layer 17 and of the ceramic piezoelectric layer 10 or are dispersed in the adhesive layer 18 or 22 to enhance the capacitive coupling through that layer. High dielectric constant particles added to facilitate coupling may be PZT, barium titanate, or the like, having a particle size of about 0.1 to 2 micron and a concentration of about 10 to 50 percent by weight in the adhesive material. If conductive particles such as carbon particles are used, they should be distributed so as not to cause continuous contact in the lateral direction in the adhesive layer. According to one embodiment, the adhesive layer contains small dispersed carbon particles having a size large enough to span the bond line between the metal layer 17 and the surface 11 of the ceramic piezoelectric layer but at a low enough concentration to avoid particle-to-particle conduction.

It is also possible to use a nonconductive adhesive layer completely covering the surface of the piezoelectric layer if the layer is thin enough to produce a high capacitive coupling between the electrode and the ceramic material. For example, if the dielectric constant of the piezoelectric material is 2000 and the dielectric constant of the adhesive material is 4 and a parasitic loss of 0.1% can be tolerated, sufficient capacitive coupling between a metal foil of gold leaf, for example, and the surface 11 of the ceramic piezoelectric layer to which it is bonded by an adhesive layer can be provided if the adhesive bonding layer is about 0.5 microns thick, which is about the size of an epoxy particle.

Figure 5:
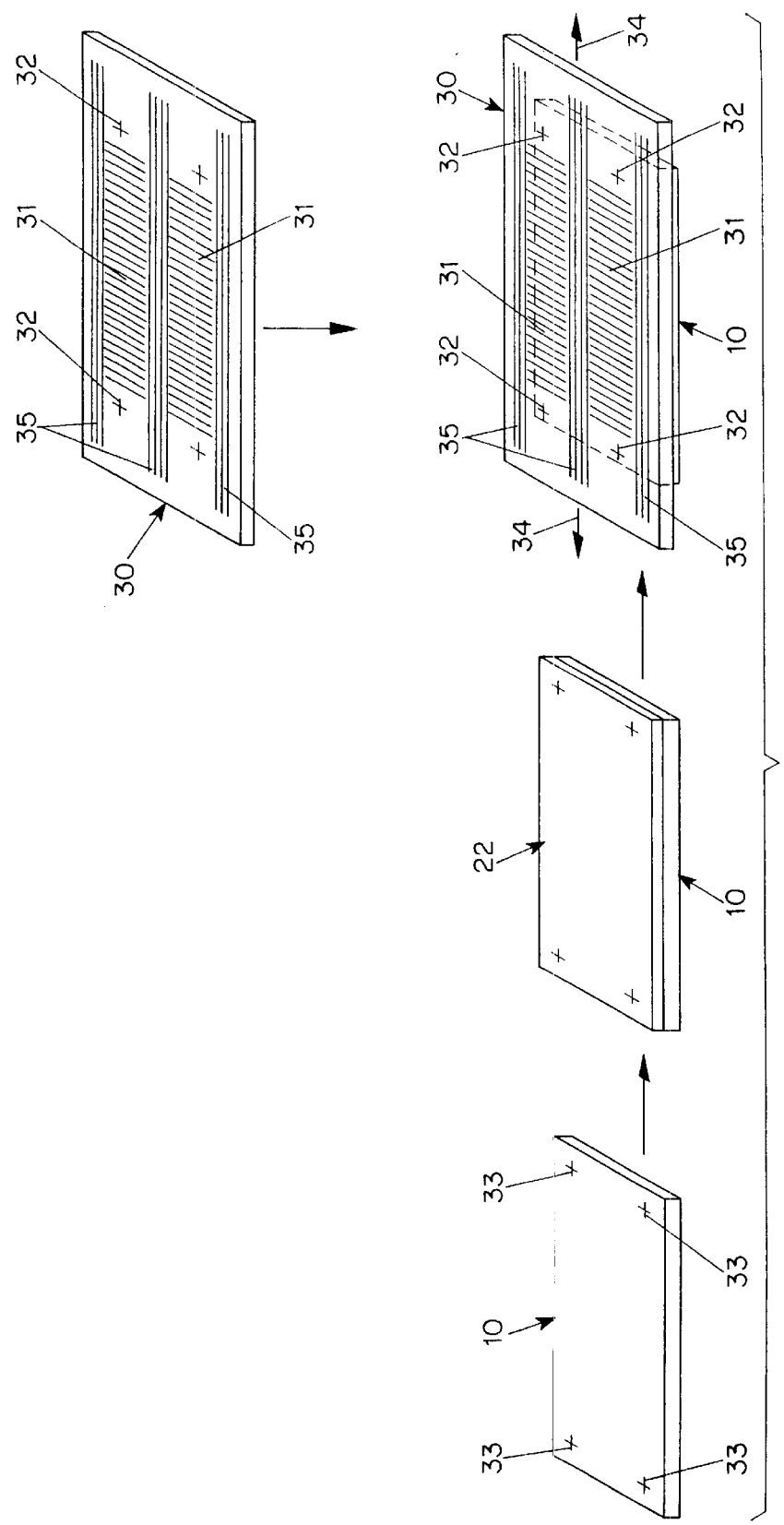
FIG. 5 is a flow diagram showing the sequence of steps in a representative method for applying electrodes to a ceramic piezoelectric member in accordance with the invention.

FIG. 5 schematically illustrates a representative method for electroding piezoelectric transducers in accordance with the invention. It will be understood that the electrodes in the metal layer 17 which are supported on one surface of the dielectric film 16 must be positioned precisely on the ceramic piezoelectric layer 10 in order to conform exactly to the positioning of corresponding pressure chambers in a pressure chamber plate to which the piezoelectric transducer is later affixed. Because the dielectric film 16 is dimensionally unstable in response to temperature and humidity variations, for example, the desired precision of placement of electrodes on the piezoelectric layer cannot be achieved even with very close control of temperature and humidity.

To overcome this problem in accordance with the invention, a dielectric film 30 is provided with one or more patterns 31 of transducer actuating electrodes in which the dimensions are a few percent, for example, approximately two percent smaller than the dimensions of the electrode pattern desired to be applied to the ceramic piezoelectric layer 10. Fiducial marks 32 are also applied to the dielectric film 30 at locations which correspond to fiducial marks 33 positioned on the surface of the ceramic piezoelectric layer 10 at locations corresponding to the required dimensions of the electrode patterns 31. After an adhesive layer 22 has been applied to the ceramic piezoelectric layer 10, the dielectric film 30 is placed over the piezoelectric layer with the electrode patterns 31 facing the piezoelectric layer and the dielectric film is stretched, as indicated by the arrows 34 in FIG. 5, until the fiducial marks 32 are exactly aligned with the fiducial marks 33 on the piezoelectric layer. Thereafter, the layers are pressed into contact and bonded in the manner described above with respect to FIGS. 1–4.

As shown in FIG. 5, the dielectric film 30 is larger than the piezoelectric layer 10 and the metalization carried by the dielectric film 30 includes arrays 35 of conductors extending beyond the area of the piezoelectric layer. These conductors are connected to the electrode patterns 31 to permit application of actuating potentials to the electrode patterns 31 from remote locations.

Figure 6:
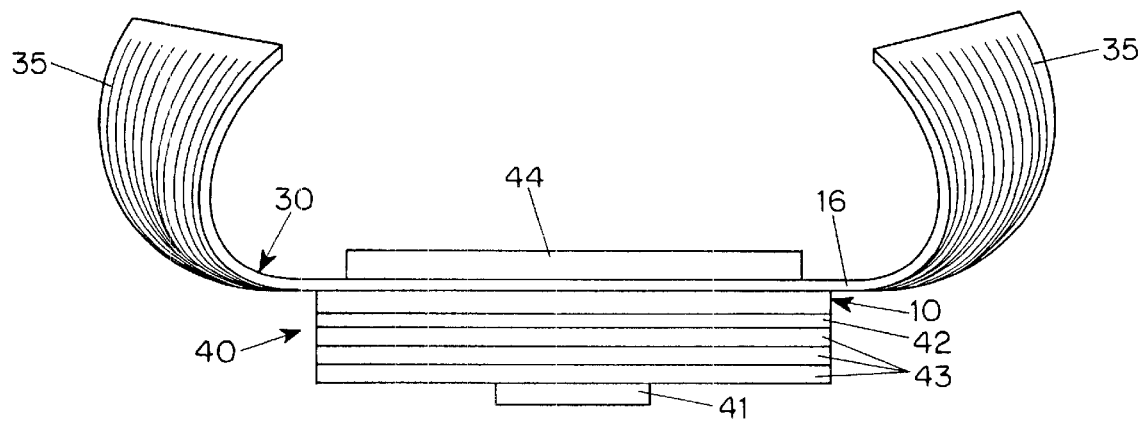
FIG. 6 is a schematic sectional view illustrating a portion of an ink jet printhead containing a piezoelectric transducer with electrodes which have been affixed thereto in accordance with the invention.

In the embodiment illustrated in FIG. 6, an ink jet printhead 40 includes a piezoelectric layer 10 and a dielectric film 30 containing an electrode pattern of the type shown in FIG. 5 which is bonded to one surface of the layer 10 in the manner described above and having arrays of conductors 35 extending away from the electrode patterns 31 on the piezoelectric layer 10 so as to permit electrical connection to the electrode patterns 31 from remote locations. The ink jet head 40 may be of a conventional plate package design as described, for example, in the Hoisington et al. U.S. Pat. No. 4,835,554 issued May 30, 1989, the disclosure of which is incorporated herein by reference, containing an orifice plate 41, an ink pressure chamber plate 42 and further plates 43 containing ink passages for supplying ink to chambers in the pressure chamber plate 42 and for conducting ink therefrom to the orifice plate 41. In addition, a backing plate 44 engages the dielectric film 30 and may have an attached heater so as to constitute a heat spreader if hot melt ink is used in the printhead 40.

Figure 7:
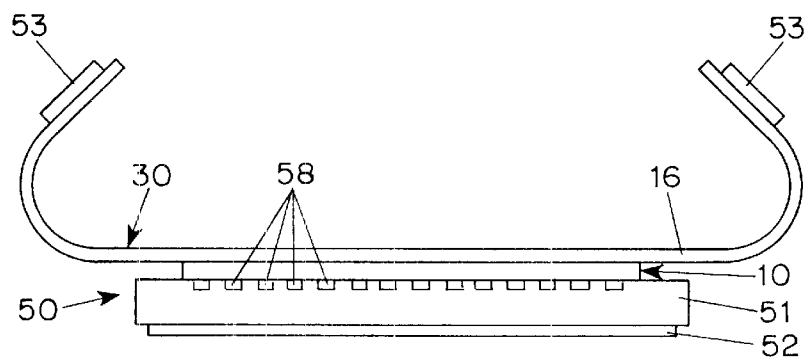
FIGS. 7–9 illustrate modifications of the arrangement shown in FIG. 6.

In the embodiment shown in FIG. 7, a printhead 50 includes a piezoelectric transducer 10 affixed to a carbon pressure chamber plate 51 of the type described in the above-mentioned Moynihan et al. applications, the disclosures of which are incorporated by reference herein. The carbon plate 51 contains ink pressure chambers 58 and also includes passages leading from the pressure chambers to corresponding orifices in an orifice plate 52. In order to actuate the piezoelectric transducer 10 and to selectively eject ink drops through orifices in the orifice plate, the piezoelectric transducer 10 is arranged to be actuated by electrodes formed on one surface of the film dielectric 30 which have been applied to the piezoelectric layer in the manner described above. The selective transducer actuation signals are generated by integrated circuit driver chips 53 at locations spaced from the transducer and are transmitted to the transducer through conductor arrays 35 on the dielectric film 30 of the type shown in FIG. 6.

Figure 8:
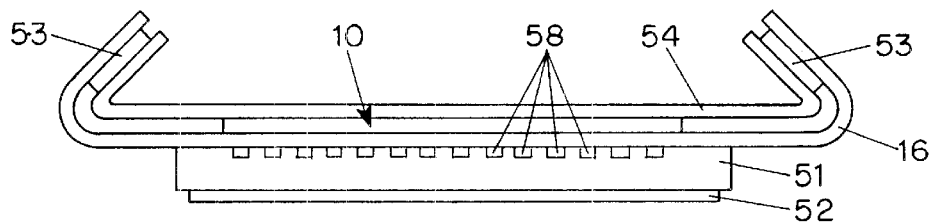

The dielectric film 16 carrying the electrodes affixed to the piezoelectric plate 10 in the manner described above may be sufficiently thin and compliant to transmit impulses from the piezoelectric layer to the pressure chambers in the carbon plate 51 without substantial loss of impulse energy. In this case, as shown in FIG. 8, the piezoelectric transducer 10 with the affixed dielectric film 16 carrying the actuating electrode pattern and the connecting conductors in the manner described above may be affixed to a carbon plate 51 with the dielectric film 16 interposed between the piezoelectric layer 10 and the pressure chambers 58 which are formed in carbon plate 51. Moreover, in order to enhance the actuation of the piezoelectric layer 10, a second dielectric film 54 carrying electrode patterns may be affixed in the manner described above to the side of the piezoelectric layer 10 opposite the side to which the electrodes in the dielectric film 16 are affixed, with the electrodes on each dielectric film being aligned in correspondence with the pressure chambers in the plate 51. With the enhanced deflection of the piezoelectric layer 10 provided by this arrangement, the printhead can be operated with lower transducer actuating potentials or with increased drop size ejection for the same actuating potentials.

In addition to permitting connection of the actuating electrode to remote driver chips 53 as shown in FIGS. 7 and 8, the provision of conductor arrays 35 on a dielectric film extending away from the surface of a piezoelectric layer also permits further conductors to be included for the purpose of grounding or for application of power to a heater or a thermistor, for example.

Figure 9:
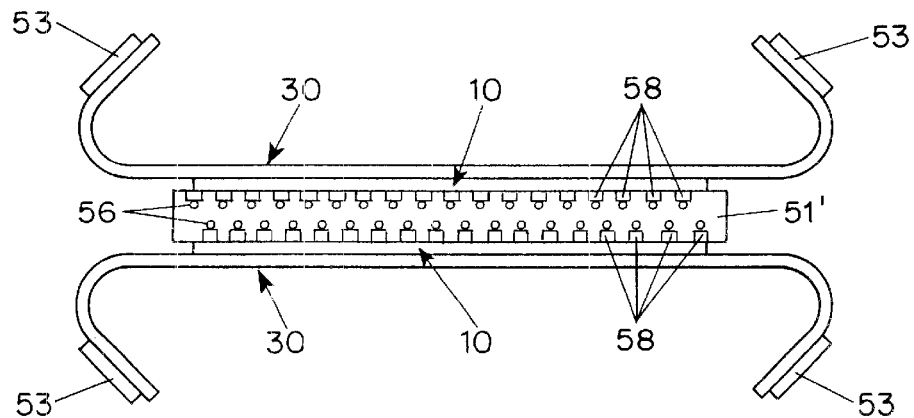

In the further embodiment shown in FIG. 9, a carbon pressure chamber plate 55 has ink pressure chambers 58 formed on both sides, as described in the above-mentioned Moynihan et al. applications. In this case, the plate 55 also has internal orifice passages 56 leading from the pressure chambers to one edge of the carbon plate to conduct ink to corresponding orifices in an orifice plate to be affixed to the edge of the carbon plate. With this arrangement ceramic piezoelectric transducers 10 with corresponding dielectric films 30 having electrodes and conductor arrays of the type shown in FIG. 6 are affixed to both sides of the carbon plate in conformance with the pressure chambers therein.

Although the invention has been described herein with reference to specific embodiments, many modifications and variations therein will readily occur to those skilled in the art. Accordingly, all such variations and modifications are included within the intended scope of the invention.

We claim:

1. An ink jet printhead comprising a ceramic piezoelectric transducer layer, a pattern of deformable electrode material adhesively bonded to a surface of the ceramic piezoelectric layer and a chamber plate with a surface formed with ink pressure chambers affixed to the ceramic piezoelectric layer with the ink pressure chambers disposed at locations to corresponding to the locations of electrodes in the pattern of deformable electrode material.

2. An ink jet printhead according to claim 1 further comprising a dielectric film to which the pattern of deformable electrode material is affixed and which extends beyond an edge of the surface of the ceramic piezoelectric layer, a pattern of conductors on the surface of the dielectric film connected to corresponding electrodes in the pattern of deformable electrode material bonded to the surface of the ceramic piezoelectric layer and extending beyond the edge of the surface of the ceramic piezoelectric layer, and a driving component connected to the pattern of conductors at a location spaced from the surface of the ceramic piezoelectric layer.

3. An ink jet printhead according to claim 1 including a further pattern of deformable electrode material adhesively bonded to an opposite surface of the ceramic piezoelectric layer containing electrodes disposed at locations corresponding to pressure chambers in the chamber plate.

4. An ink jet printhead according to claim 1 including a deformable dielectric film carrying the pattern of deformable electrode material disposed between the surface of the ceramic piezoelectric material and the chamber plate.

5. An ink jet printhead according to claim 1 wherein the chamber plate is a carbon plate.

6. An ink jet printhead according to claim 5 wherein the chamber plate has opposed surfaces formed with ink pressure chambers and including a ceramic piezoelectric transducer layer affixed to each of the chamber plate surfaces formed with pressure chambers, each of the ceramic piezoelectric transducer layers having a pattern of deformable electrode material adhesively bonded to a surface of the ceramic piezoelectric layer containing electrodes disposed at locations corresponding to the locations of adjacent ink pressure chambers in the chamber plate.

* * * * *